United States Patent [19]
Birleson

[11] Patent Number: 6,163,684
[45] Date of Patent: *Dec. 19, 2000

[54] BROADBAND FREQUENCY SYNTHESIZER

[75] Inventor: Vince Birleson, West Tawakoni, Tex.

[73] Assignee: Microtune, Inc., Plano, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/904,907

[22] Filed: Aug. 1, 1997

[51] Int. Cl.[7] ..................................... H04B 1/16
[52] U.S. Cl. ................... 455/182.3; 455/176.1; 455/180.3; 375/376
[58] Field of Search ............... 455/173, 176.1, 455/178.1, 180.3, 182.1, 182.3, 183.1, 189.1, 190.1, 192.3; 375/376, 334

[56] References Cited

U.S. PATENT DOCUMENTS

| | | | |
|---|---|---|---|
| 3,769,589 | 10/1973 | Buntschuh | 325/419 |
| 4,061,980 | 12/1977 | Sato | 455/183.1 |
| 4,223,406 | 9/1980 | Someno | 455/180 |
| 4,703,520 | 10/1987 | Rozanski et al. | 455/75 |
| 5,448,763 | 9/1995 | Gillig | 455/76 |
| 5,471,652 | 11/1995 | Hulkko | 455/76 |
| 5,717,730 | 2/1998 | Parkash et al. | 375/376 |
| 5,752,174 | 5/1998 | Matai et al. | 455/483.1 |
| 5,752,175 | 5/1998 | Roullet et al. | 455/183.1 |

*Primary Examiner*—Daniel S. Hunter
*Assistant Examiner*—Darnell R. Armstrong
*Attorney, Agent, or Firm*—Fulbright & Jaworski L.L.P.

[57] ABSTRACT

A broadband frequency synthesizer including a first local oscillator signal generated in a first phase locked loop. A second local oscillator signal is generated in a second phase locked loop. Third and fourth phase locked loops provide inputs to the second phase locked loop to control the second local oscillator frequency. The system and method provides for small step size tuning while maintaining wide phase lock loop bandwidth.

31 Claims, 3 Drawing Sheets

BROADBAND FREQUENCY SYNTHESIZER

RELATED APPLICATIONS

This application is related to co-pending application entitled DUAL MODE TUNER FOR CO-EXISTING DIGITAL AND ANALOG TELEVISION SIGNALS, assigned Ser. No. 08/904,693, co-pending application entitled INTERFERENCE-FREE BROADBAND TELEVISION TUNER, assigned Ser. No. 08/904,906, now U.S. Pat. No. 5,847,612, issued Dec. 8, 1998, and co-pending application entitled BROADBAND INTEGRATED TELEVISION TUNER, assigned Ser. No. 08/904,908, all of which are filed concurrently herewith and assigned to a common assignee, which applications are hereby incorporated by reference herein.

TECHNICAL FIELD OF THE INVENTION

This invention relates to frequency synthesizers and more particularly to frequency synthesizers with fine resolution and broad phase lock loop band widths for dual conversion receivers.

BACKGROUND OF THE INVENTION

It is well known in the art to use local oscillators (LOs) to drive dual conversion circuits. In such circuits, a first LO signal is mixed with an RF signal in a first mixer to generate a first intermediate frequency (IF) signal. Then, the first IF signal is mixed with a second LO signal in a second mixer to generate a second IF signal. The frequencies of the first and second LO signals are usually selected so that the first and second IF signals occur either at a specific frequency or within a specified frequency range.

The LOs may generate spurious signals due to injection locking, and at harmonic, and subharmonic frequencies of the desired signal. One problem in the prior art occurs when these spurious signals feed back into the RF input or couple to some other part of the conversion circuit. Signal coupling is likely to occur when the local oscillators and the conversion circuit are constructed on an integrated circuit substrate. One method of eliminating the effects of spurious signals is to use band pass filters which attenuate the spurious frequencies in the IF signals. A problem with this method arises when the spurious signals are close in frequency to the incoming RF signal or to the selected IF signals.

It is typical in the prior art to make the reference frequency which creates the LO output reference frequency equal to the step size of the frequency synthesizer system. It is further typical of the prior art to employ a single loop frequency synthesizer to create the first LO in tuners. For example, if the step size of the system is 62.5 Khz, then the reference frequency to the single loop PLL would also be 62.5 Khz.

It is highly desirable to suppress harmonics and spurs of the reference that are in band to a level below the noise floor of the VCO, requiring the loop bandwidth of the PLL to be less than the reference frequency. In the case where the reference is the step size, the loop bandwidth is rather narrow.

Consequently, it is desirable to provide both a small step size as well as a wide bandwidth for the LO signal providing for enhanced immunity to spurs as well as providing for a narrow bandwidth COHO in the tuner.

A television tuner that is constructed on a integrated circuit substrate is disclosed in the pending patent application entitled MONOLITHIC TELEVISION TUNER, filed Apr. 21, 1995 and assigned Ser. No. 08/426,080. However, that application does not disclose the present system and method for an interference free broadband tuner circuit.

SUMMARY OF THE INVENTION

For an RF signal, such as television signal, which has a predetermined shape, a conversion circuit can be controlled so that the shape of the output signal is proportionatal to the shape of the input signal. Also, the output signal shape may have the same orientation as the RF signal shape or it may be a mirror-image of the RF signal shape. A conversion circuit is controlled by the local oscillator (LO) frequencies that are applied to the circuit's mixers. If the LO frequencies are selected to be lower than the desired intermediate frequency (IF) signal, then the resulting IF signal will have the same shape as the RF signal. On the other hand, if the LO frequencies are selected to be higher than the desired IF signal, then the mixer output will be an IF signal with a shape that is a mirror-image of the RF signal. When two or more mixers are used in a conversion circuit, various combinations of the LO frequencies can be used to generate IF signals having a desired shape.

A wide loop bandwidth for first reference signal LO1 and for second reference signal LO2 is preferred because this yields good close-in phase noise characteristics for these two signals. This is important because it allows the COHO of the tuner to have a narrow loop bandwidth, which yields a lower distortion video detector. For example, certain content within the video signal, such as the horizontal sync signal at approximately 15 Khz, would be partially tracked by a wide band COHO leading to distortion in the detection process. If the bandwidth of the COHO is less than 15KHz, then the COHO would not partially track the horizontal sync signal leading to a near distortion free detection process. In the prior art, the oscillators used for conversion to IF typically do not have good close-in phase noise characteristics, requiring a COHO with wide loop bandwidth to track out this noise. It is thus typical in the prior art to employ wider bandwidth COHO's, which have the undesirable trait of partially tracking strong signals in the video signal, such as horizontal sync, leading to distortion in the detection process.

It is generally known that the immunity of a phase locked loop to injection locking is determined by the product of the quality factor, Q, of the VCO and the loop bandwidth. For the case of a VCO implemented on a single chip, it is typically difficult to realize high Qs. This conflicts with the integrated circuit implementation of a RF system with PLLs in that the other circuitry sharing the common substrate is a source of spurs that may be passed onto the PLLs output or lead to injection locking by the PLL. Since a high Q VCO is not feasible without external components, the benefit of a wide loop bandwidth of the PLL is now more pronounced.

A further advantage of the frequency synthesis system is that it uses, for example, a 5.25 Mhz crystal oscillator as a reference. This 5.25 Mhz reference is above the baseband signal of the system, thus avoiding in-band noise produced by the reference and its harmonics.

It is a still further technical advantage of the present invention to provide a system and method for small step size tuning while maintaining wide PLL bandwidth in the synthesizer.

It is another technical advantage of the present invention to provide a system and method for adjusting the local oscillator frequencies of a conversion circuit to minimize interference from spurious local oscillator frequencies.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

These and other objects, features and technical advantages are achieved by a system and method in which multiple phase locked loop (PLL) circuits are used to drive voltage controlled oscillators (VCOs) in order to generate the LO signals for a dual mixer conversion circuit.

Figure 1:
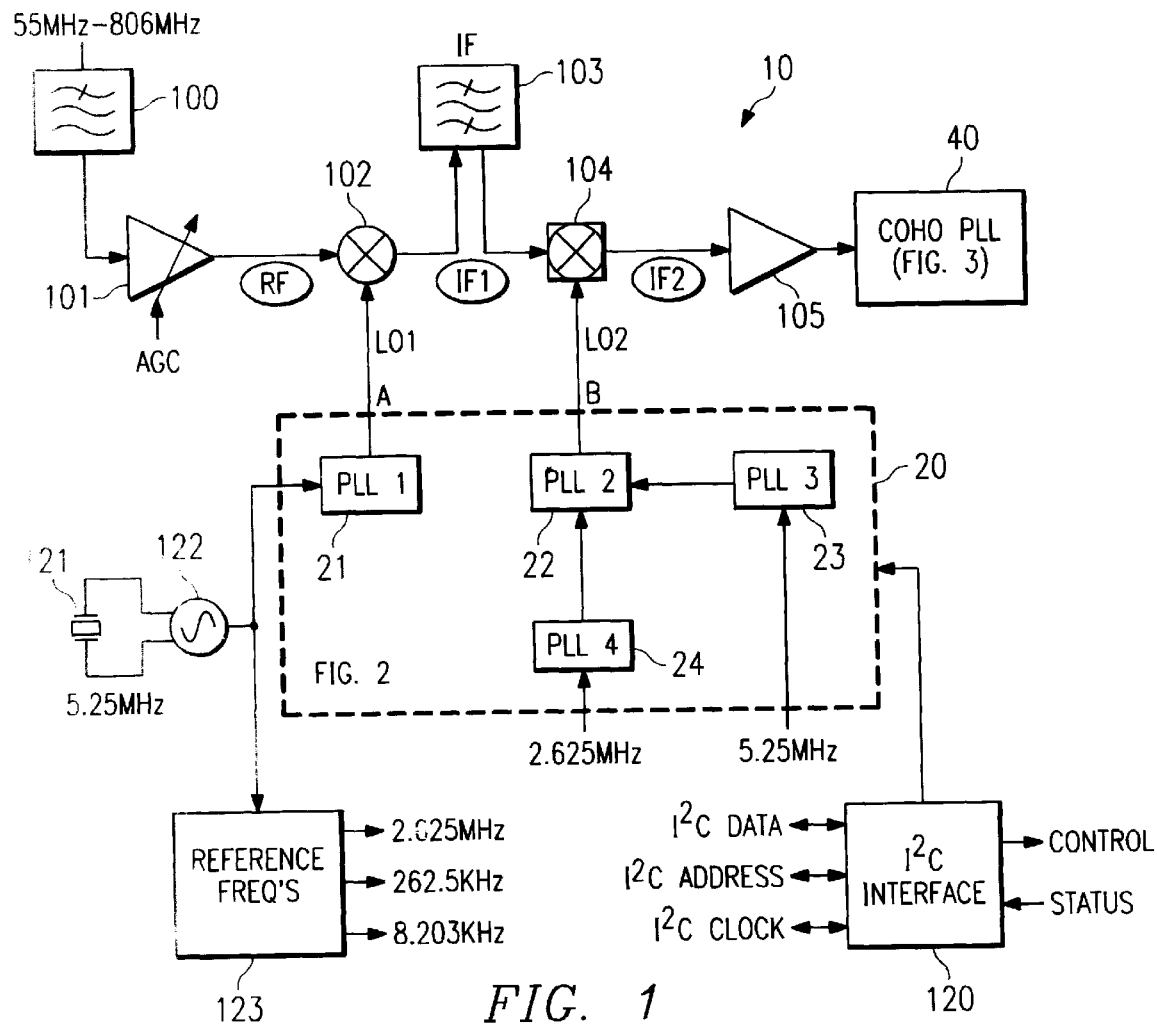
FIG. 1 is a high-level block diagram of a conversion circuit for a television tuner using the local oscillator of the present invention.

FIG. 1 shows conversion circuit 10 having dual mixers 102 and 104 which receive LO signals LO1 and LO2 on lines A and B from local oscillator circuit 20. In the preferred embodiment, conversion circuit 10 is used in a television tuner circuit as described in the above-referenced co-pending application entitled DUAL MODE TUNER FOR CO-EXISTING DIGITAL AND ANALOG TELEVISION SIGNALS.

In a television system, signals representing individual channels are assigned to specific frequencies in a defined frequency band. For example, in the United States, television signals are generally transmitted in a band from 55 Mhz to 806 Mhz. The received RF signals pass through a front-end filter 100. In the prior art, filter 100 usually was a bandpass tracking filter that allowed only a narrow range of frequencies to pass. In the preferred embodiment, filter 100 is a low pass filter that is designed to remove all frequencies above an input cutoff frequency. The input cutoff frequency is chosen to be higher than the frequencies of the channels in the television band. The output of filter 100 then passes through amplifier 101 to adjust the signal level that is provided to mixer 102. When conversion circuit 10 is used in a receiver circuit, amplifier 101 may be an automatic gain control (AGC) amplifier that is adjusted to maintain an overall receiver gain. Following amplifier 101, the RF signal is provided to mixer 102 where it is mixed with a local oscillator signal LO1 from local oscillator circuit 20. The output of mixer 102 is first intermediate frequency signal IF1. Typically, the frequency of LO1 is variable and will be selected based upon the channel in the RF signal that is being tuned. LO1 is selected so that the mixing of LO1 and RF in mixer 102 generates an IF1 signal either at a specified frequency or within a narrow range of frequencies.

Following mixer 102, IF filter 103 is a band pass filter that is used to remove unwanted frequencies and spurious signals from the IF1 signal. The band of frequencies that are passed by filter 103 is a matter of design choice depending upon the IF1 frequency selected in each particular conversion circuit. In the preferred embodiment, IF filter 103 is centered at 1090 Mhz and has a 14 Mhz pass band. This allows the selected IF1 frequency to vary within 1083–1097 Mhz. Mixer 104 receives both the filtered IF1 signal from filter 103 and a second local oscillator signal (LO2) from oscillator circuit 20. These signals are mixed to generate a second intermediate frequency (IF2) at the output of mixer 104. In the preferred embodiment, mixer 104 is an image rejection mixer that rejects image frequencies from the IF2 signal. LO2 may be a variable or fixed frequency depending upon whether IF1 is at a fixed frequency or if it varies over a range of frequencies. In either case, the frequency of LO2 is selected to generate a fixed frequency IF2 signal. The IF2 signal is provided through amplifier/buffer 105 to additional processing circuitry (not shown) to generate either digital or analog television signals. In the preferred embodiment, the frequency of IF2 is selected to be 45.75 Mhz.

The output of amplifier 105 is also provided to coherent oscillator circuit (COHO) 30. COHO 30 (FIG. 3) creates two reference signals for signal detection.

LO1 is generated in local oscillator circuit 20 by PLL1 21 and LO2 is generated by PLL2 22. PLL3 23 and PLL4 24 provide reference inputs to PLL2 22. I2C 120 controls local oscillator circuit 20 and causes PLL1–4 21–24 to select the correct LO1 and LO2 frequencies. Local oscillator circuit 20 receives reference signals from oscillator 122 and reference frequency generator 123. Oscillator 122 provides a 5.25 Mhz output based on crystal 121. Frequency generator 123 divides the 5.25 Mhz signal from oscillator 122 to generate additional reference signals at other frequencies.

Figure 2:
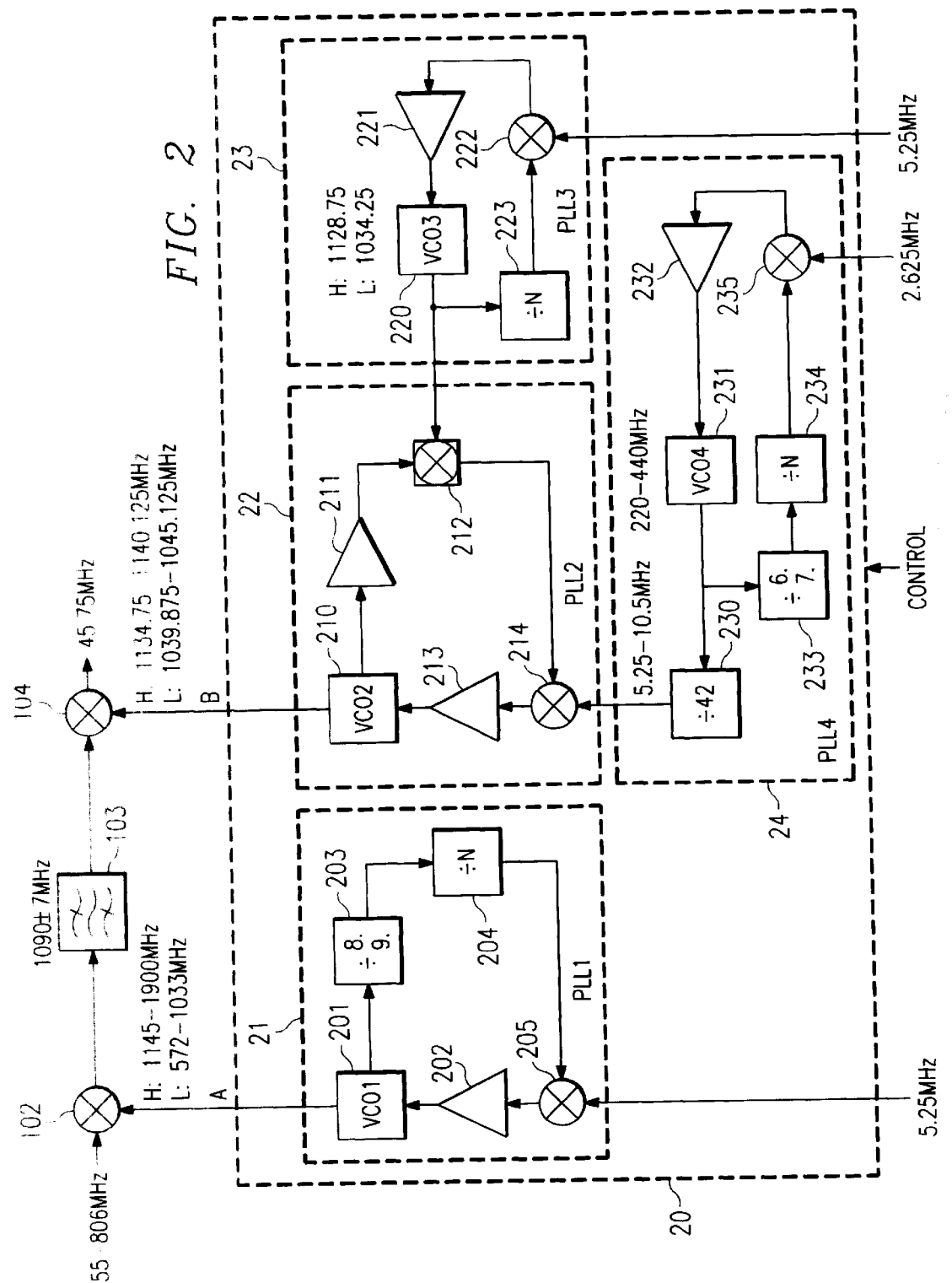
FIG. 2 is a block diagram of the local oscillator circuit of the present invention.

Local oscillator circuit 20 and PLL1–4 21–24 are shown in greater detail in FIG. 2. PLL1 21 provides the first local oscillator signal (LO1) to mixer 102. PLL2 22, PLL3 23 and PLL4 24 cooperate to provide the second local oscillator signal (LO2) to mixer 104. PLL1 21 receives a 5.25 Mhz reference signal at phase comparator 205. The output of phase comparator 205 feeds loop amplifier 202 which, in turn, provides the input for VCO1 201. There are two outputs from VCO1 201. One output provides the LO1 signal to mixer 102 over line A. The other output goes into a divider network comprised of ÷8/÷9 circuit 203 and ÷N circuit 204. Divider circuits 203 and 204 divide the output of VCO1 201 down to a signal having a frequency of 5.25 Mhz. This divided-down signal is compared with the 5.25 Mhz reference signal in phase comparator 205 to complete the phase locked loop.

The output of VCO1 21 is variable between 1145–1900 Mhz on the high side and 572–1033 Mhz on the low side. Frequencies below 572 Mhz are not used in LO1 to minimize the introduction of interference frequencies into the conversion circuit. LO1 is chosen from within these ranges so that IF1 signal is within the 1090 Mhz ±7 Mhz pass band of filter 103. The 5.25 Mhz reference signal creates an output stepsize of 5.25 Mhz in LO1 which is utilized for course tuning in conversion circuit 10. In the preferred embodiment, PLL1 21 has a bandwidth on the order of 500 Khz. A wide bandwidth is preferable to get good close-in phase noise characteristics.

Fine tuning is accomplished by LO2 which is produced by the operation of 3 phase lock loops PLL2 22, PLL3 23 and PLL4 24. PLL4 24 has the same basic configuration as PLLI 21. It has reference signal of 2.625 Mhz which is input to phase comparator 235. The output of phase comparator 235 drives loop amplifier 232 which in turn drives VCO4 231. The output of VCO4 231 has frequency range of 220–440 Mhz with a 2.625 Mhz stepsize and is provided to two divider circuits. One output of VCO4 231 goes to a divider network comprised of ÷6/÷7 circuit 233 and ÷N circuit 234. The effect of divider network 233 and 234 is to divide the output signal of VCO4 230 back down to 2.625 Mhz. This signal is then compared with the 2.625 Mhz reference signal in phase comparator 235 to complete the phase locked loop. The other output of VCO4 231 is provided to ÷42 circuit 230. The output of divider 230 is a signal with a frequency range of 5.25–10.5 Mhz and having a 62.5 Khz stepsize. The output of divider 230 serves as a reference signal for PLL2 22.

In PLL3 23, a 5.25 Mhz reference signal is input to phase detector 222. Phase detector 222 drives loop amplifier 221 which in turn drives VCO3 220. The output of VCO3 23 is divided back down to 5.25 Mhz by ÷N circuit 223 and then fed back into phase detector 222 to complete the loop. The output of VCO3 23 is selectable between 1128.75 Mhz and 1034.25 Mhz. The selection between these two frequencies determines whether LO2 is on the high side or the low side.

In PLL2 22, the signal from PLL4 24 is received by phase comparator 214 which in turn drives loop amplifier 213. The output of loop amplifier 213 controls VCO2 210. VCO2 210 provides the LO2 signal for mixer 104 over line B. The LO2 signal varies between 1134.75–1140.125 Mhz on the high side and 1039.875–1045.125 Mhz on the low side. Another output from VCO2 210 passes through buffer amplifier 211 and then drives image reject mixer 212. Mixer 212 receives its other input from PLL3 23. Since the signal from PPL3 23 is near the frequency of the LO2 signal in VCO2 210, it is important that the reverse isolation between mixer 212 and VCO2 210 is good to prevent the PLL3 23 signal from passing into the LO2 output of VCO2 210. The output of mixer 212 is provided to phase comparator 214 to complete the loop in PLL2 22.

In the preferred embodiment, the loop bandwidths of PLL2 22, PLL3 23 and PLL4 24 are all wide to provide good overall close-in phase noise. PLL2 22 and PLL3 23 have bandwidths of approximately 300–500 Khz. The bandwidth of PLL4 24 is approximately 200–300 Khz. These bandwidths give phase noise at 100 Khz that is satisfactory for digital television.

Figure 3:
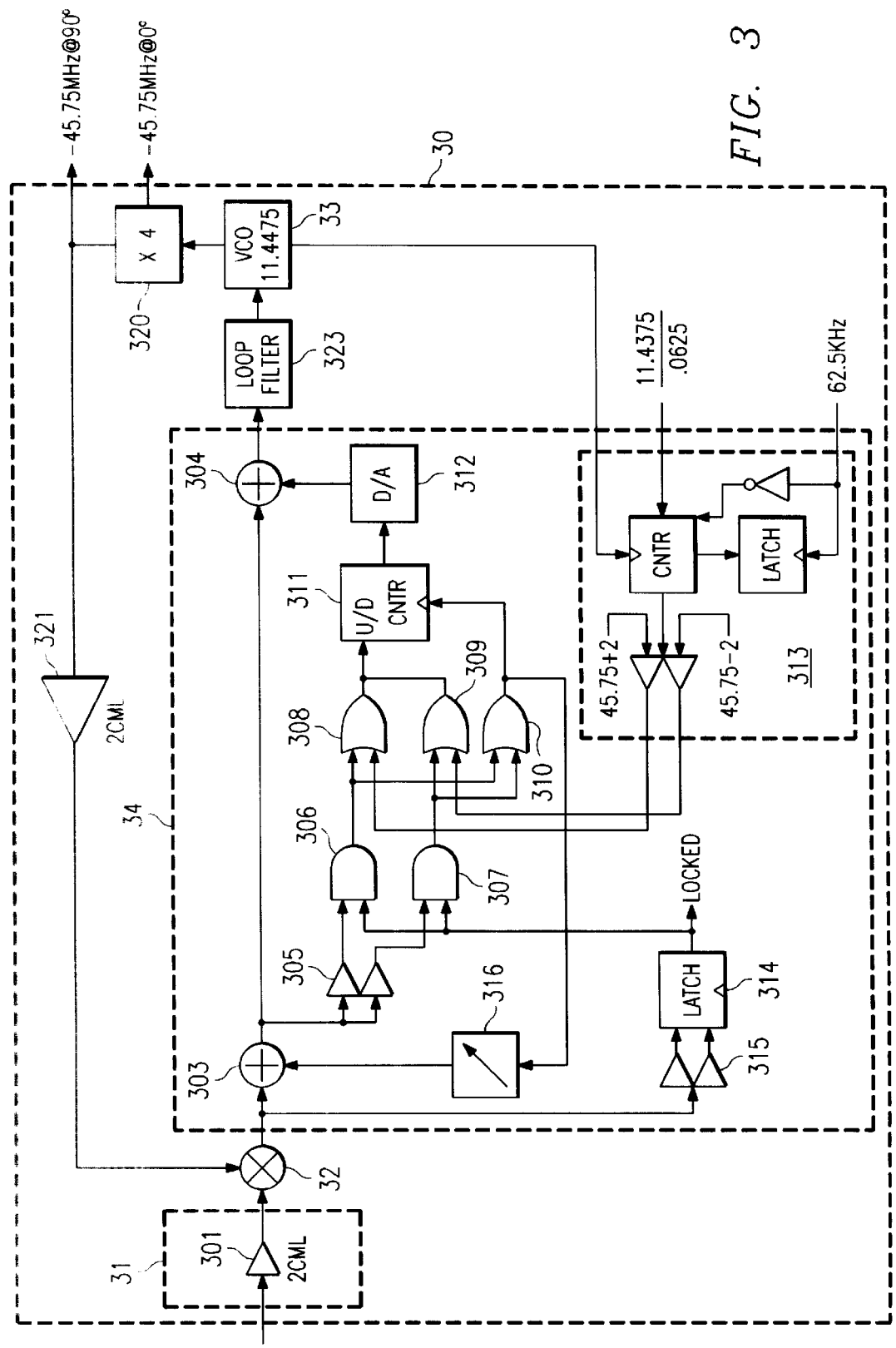
FIG. 3 shows the coherent oscillator of the present invention.

COHO 30, as shown in FIG. 3, is a phase lock loop reference that locks on the carrier for the received analog or digital television signal. For an analog signal, the loop requires a bandwidth on the order of 25 Khz. On the other hand, because the digital carrier is at a much lower level, a digital signal requires a bandwidth on the order of 1 Khz. Therefore, in the preferred embodiment, COHO 30 is designed to work on the digital bandwidth since it is within the analog bandwidth requirements. In contrast to a normal single conversion receiver, a narrow loop bandwidth can be used in tuner circuit 10 because the close-in noise of LO1 and LO2 is very good. Typically, in a single conversion receiver, the loop bandwidth of the first local oscillator is narrow which creates high noise close-in. That noise would have to be suppressed with a wide bandwidth COHO. In the preferred embodiment, the improved noise characteristics of LO1 and LO2 allow the use of COHO 30 with a narrow loop bandwidth.

COHO 30 is comprised of a phase locked loop which provides reference signals to two detectors (not shown). The reference signal for the first detector is at 0° relative to the carrier signal for the analog or digital signal. The reference signal for the down converter is at 90° with the phase of the carrier signal. The input to COHO 30 is provided from amplifier 111 through converting circuit 31. The signal passes through current mode logic circuit 301 and divider 302. VCO 33 of COHO 30 runs at one quarter the frequency of the carrier signal. Circuit 31 converts the input signal to current mode logic and then divides the signal frequency by 4 to match the frequency in the loop. Following divider 302, the signal goes into phase detector 32.

The output of phase detector 32 passes through control circuit 34 and loop filter 323 and is then input to VCO 33. Assuming that COHO 30 is locked right on the 45.75 MHz picture carrier for analog television, VCO 33 will normally operate at 11.4375 MHz. The output of VCO 33 passes through frequency multiplier 320 which works in conjunction with VCO 33 to produce the in-phase/0° and quadrature/90° outputs at 45.75 Mhz for the two detectors. The output from multiplier 320 also feeds back to phase detector 32 through current mode logic converter 321 and divider 322 to complete the phase locked loop circuit.

Control logic 34 is used in signal acquisition to ensure that COHO 30 searches in the correct direction and locks on the picture carrier for analog television signals, as opposed to locking on the neighboring audio signal. Control 34 does an upsweep search looking for the picture carrier to avoid locking on to the higher frequency audio carrier. This is important for situations in which the carrier is off-frequency. For example, in a cable television analog signal, the carrier frequency can be off by up to 2 MHz. Accordingly, COHO 30 needs control 34 to ensure that the loop locks onto the proper frequency. It is likely that digital television signals will also vary up to 2 MHz from the expected frequency in some situations. Therefore, control 34 is used for both analog and digital signals.

Circuit 313 compares the actual output frequency of VCO 33 with the expected frequency of 11.4375 MHz. Circuit 313 generates an error signal which is provided to control logic gates 308–310. The output of gates 308–310 goes into up-down counter 311. Digital-to-analog converter 312 converts the output of counter 311 to an analog error signal which is added into the signal path by adder 304. The output of adder 304 provides an offset control signal for VCO 33.

Sweep circuit 316 forces control 34 to search from lower frequencies to higher frequencies to avoid locking on the audio signal instead of the picture carrier. The output of sweep circuit 316 is provided to adder 303 which adds an offset to the output of phase detector 32 to force this sweep in the right direction. This low-to-high acquisition could also be implemented by setting the bias for VCO 33 to a low level, thereby forcing the output of VCO 33 to a low frequency. The error signal from phase detector 32 would then pull the bias for VCO 33 up in frequency in which case it will sweep in the correct direction.

Detector 315 and latch 314 function as a lock detection circuit. The signal from phase detector 32 is compared to a reference signal and if the signal is inside the reference then it is locked, otherwise it is not locked. The signal from latch 314 is provided to logic gates 306 and 307 along with the output of comparator 305. The output of gates 306 and 307 serves as the other input for logic gates 308–310.

Although the present invention and its advantages have been described in detail, it should be understood that various changes, substitutions and alterations can be made herein without departing from the spirit and scope of the invention as defined by the appended claims.

What is claimed is:

1. A tuner for receiving RF signals, said tuner comprising:
an input filter receiving an RF signal having a plurality of channels and removing frequencies in said RF signal above an input cutoff frequency;
a first mixer having a first input coupled to said input filter and a second input coupled to a first reference signal, wherein said first mixer generates a first IF signal;
a first IF filter coupled to said first mixer and filtering said first IF signal;
a second mixer having a first input coupled to said first IF filter and a second input coupled to a second reference signal, wherein said second mixer generates a second IF signal;
a coherent reference phase lock loop fed by said second IF signal for generating a third reference signal; and
a frequency synthesizer comprising wide band phase locked loops (PLLs) for generating said first and second reference signals, said frequency synthesizer having a phase noise characteristic that allows said coherent reference phase lock loop to have a narrow loop bandwidth.

2. The tuner of claim 1 wherein said first reference signal provides coarse tuning and wherein said second reference signal provides fine tuning.

3. The tuner of claim 1 wherein said first reference signal provides coarse tuning with step size of greater than 4.5 MHz.

4. The tuner of claim 2 wherein said coarse turning is provided by a single voltage controlled oscillator (VCO) and one of said wide band PLLs providing a highly coherent reference signal suitable for up-converting said signal.

5. The tuner of claim 4 wherein the PLL reference signal is greater than 4.5 MHz.

6. The tuner of claim 1 wherein said second reference signal provides fine tuning with step size less than or equal to 100 Khz.

7. The tuner of claim 6 wherein said fine tuning is provided by three VCOs and three of said wideband PLLs providing a highly coherent reference signal suitable for down-converting said signal.

8. The tuner of claim 7 wherein said three PLLs utilize two reference signals, one greater than 2.25 MHz and the other greater than 4.6 MHZ.

9. The tuner of claim 1 constructed substantially on a single monolithic substrate.

10. The method of receiving RF signals comprising the steps of:
removing from an RF signal all frequencies above a cutoff frequency to create a filtered input signal;
creating a first reference frequency signal for mixing with said filtered input signal to establish a first IF signal;
creating a second reference frequency signal for mixing with said first IF signal to create a second IF signal; and
generating said first and second reference signals using a plurality of wideband PLL circuits where said first reference frequency signal achieves coarse tuning and said second reference frequency signal achieves fine tuning.

11. The method of claim 10 wherein said coarse tuning is provided by a single VCO and a wideband PLL providing a highly coherent reference signal.

12. The method of claim 11 wherein the PLL reference signal is greater than 4.5 MHz.

13. The method of claim 10 wherein said fine tuning has a step size less than or equal to 100 Khz.

14. The method of claim 13 wherein said fine tuning is provided by three VCOs and wideband PLLs providing a highly coherent reference signal.

15. The method of claim 14 wherein said PLLs utilize two reference signals, one greater than 2.25 MHz and the other greater than 4.5 MHz.

16. The method of claim 11 wherein said coarse and fine tuning are controlled substantially on a single monolithic circuit.

17. A circuit for use in a system for selecting frequencies within a broad band, each said selected frequency having its own bandwidth, such providing first and second reference signals, said circuit comprising:
a plurality of wideband PLLs, wherein a first wideband PLL accepts a reference signal which is out of said band width of each selected frequency, said wideband PLLs having low phase noise and a step size resolution smaller than the loop band width of the individual wideband PLLs; and
wherein said wideband PLLs operate from input reference signals, some of which are out of said bandwidth, and at least one of which is within said band width and wherein said one within said bandwidth is isolated from said output reference signals.

18. The circuit of claim 17 wherein a first one of said wideband PLLs provides coarse frequency resolution under control of said out of band input reference signal and wherein the step size of said coarse resolution is equal to said out of band input reference signal.

19. The circuit of claim 18 wherein a second set of wideband PLLs provides fine frequency resolution under control of a combination of said out of band input reference signals and said at least one isolated in band input reference signal.

20. The circuit of claim 17 constructed as a monolithic circuit.

21. The circuit of claim 17 wherein a plurality of said circuits are constructed substantially on the same monolithic circuit.

22. The tuner of claim 4 wherein said one wide band PLLs has a bandwidth of approximately 500 Khz.

23. The tuner of claim 7 wherein a first one of said three wideband PLLs has a bandwidth of approximately 200–300 Khz, and the other two of said three wideband PLLs have bandwidths of approximately 300–500 Khz.

24. The method of claim 11 wherein said wideband PLL has a bandwidth of approximately 500 Khz.

25. The method of claim 14 wherein a first one of said three wideband PLLs has a bandwidth of approximately 200–300 Khz, and the other two of said three wideband PLLs have bandwidths of approximately 300–500 Khz.

26. The circuit of claim 18 wherein said first one of said wideband PLLs has a loop band width of approximately 500 Khz.

27. The circuit of claim 19 wherein said second set of wideband PLLs comprises three wideband PLLs, wherein a first one of said three wideband PLLs has a bandwidth of approximately 200–300 Khz, and the other two of said three wideband PLLs have bandwidths of approximately 300–500 Khz.

28. The tuner of claim 9, wherein said filters are constructed on said single monolithic substrate.

29. The tuner of claim 9, wherein said filters are not constructed on said single monolithic substrate.

30. The method of claim 10 wherein said coarse and fine tuning are controlled substantially on a single monolithic circuit.

31. The method of claim 14 wherein said coarse and fine tuning are controlled substantially on a single monolithic circuit.

* * * * *